(12) United States Patent
Härle et al.

(10) Patent No.: US 7,560,741 B2
(45) Date of Patent: Jul. 14, 2009

(54) LIGHTING MODULE AND METHOD FOR THE PRODUCTION THEREOF

(75) Inventors: Volker Härle, Laaber (DE); Berthold Hahn, Hemau (DE); Hans-Jürgen Lugauer, Sinzing (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/547,217

(22) PCT Filed: Jan. 15, 2004

(86) PCT No.: PCT/DE2004/000040

§ 371 (c)(1),
(2), (4) Date: Apr. 5, 2006

(87) PCT Pub. No.: WO2004/077578

PCT Pub. Date: Sep. 10, 2004

(65) Prior Publication Data

US 2006/0163601 A1     Jul. 27, 2006

(30) Foreign Application Priority Data

Feb. 28, 2003   (DE) ................................ 103 08 866

(51) Int. Cl.
*H01L 33/00* (2006.01)
(52) U.S. Cl. .......................................... 257/98; 257/99
(58) Field of Classification Search .................... 257/79, 257/86, 87, 88, 89, 90, 91, 94, 95, 98, 99, 257/100, 101, 102, 103
See application file for complete search history.

(56) References Cited

U.S. PATENT DOCUMENTS 6,066,861 A    5/2000   Höhn
(Continued)

FOREIGN PATENT DOCUMENTS

CN          1361556          7/2002
(Continued)

OTHER PUBLICATIONS

Möllmer et al., "Siemens SMT-Topled für die Oberflächenmontage", Siemens Components, vol. 29, No. 41, pp. 147-149, 1991.
(Continued)

*Primary Examiner*—N Drew Richards
*Assistant Examiner*—Paul E Patton
(74) *Attorney, Agent, or Firm*—Cohen Pontani Lieberman & Pavane LLP (57) ABSTRACT

An illumination module with at least one thin-film light emitting diode chip which is applied on a chip carrier having electrical connecting conductors and has a first and a second electrical connection side and also an fabricated semiconductor layer sequence. The semiconductor layer sequence has an n-conducting semiconductor layer, a p-conducting semiconductor layer and an electromagnetic radiation generating region arranged between these two semiconductor layers and is arranged on a carrier. Moreover, it has a reflective layer at a main area facing toward the carrier, which reflective layer reflects at least one part of the electromagnetic radiation generated in the semiconductor layer sequence back into the latter. The semiconductor layer sequence has at least one semiconductor layer with at least one micropatterned, rough area. The coupling-out area of the thin-film light emitting diode chip is essentially defined by a main area remote from the reflective layer and is free of housing material such as potting or encapsulating material.

46 Claims, 5 Drawing Sheets

U.S. PATENT DOCUMENTS

| | | | |
|---|---|---|---|
| 6,429,460 B1 * | 8/2002 | Chen et al. | 257/79 |
| 6,501,091 B1 * | 12/2002 | Bawendi et al. | 257/14 |
| 6,502,952 B1 * | 1/2003 | Hartley | 362/184 |
| 6,504,180 B1 * | 1/2003 | Heremans et al. | 257/98 |
| 6,635,363 B1 * | 10/2003 | Duclos et al. | 428/690 |
| 6,730,939 B2 | 5/2004 | Eisert | |
| 6,809,342 B2 * | 10/2004 | Harada | 257/79 |
| 6,849,881 B1 | 2/2005 | Harle et al. | |
| 2001/0045573 A1 | 11/2001 | Waitl | |
| 2002/0017652 A1 | 2/2002 | Illek et al. | |
| 2002/0084745 A1 | 7/2002 | Wang et al. | |
| 2002/0096254 A1 | 7/2002 | Kober et al. | |
| 2003/0010986 A1 * | 1/2003 | Lin et al. | 257/79 |
| 2003/0160258 A1 | 8/2003 | Oohata | |
| 2003/0168664 A1 | 9/2003 | Hahn et al. | |
| 2003/0173575 A1 * | 9/2003 | Eisert et al. | 257/95 |
| 2004/0056254 A1 | 3/2004 | Bader et al. | |
| 2004/0061433 A1 * | 4/2004 | Izuno et al. | 313/498 |
| 2004/0113167 A1 | 6/2004 | Bader et al. | |
| 2005/0244993 A1 | 11/2005 | Bogner et al. | |

FOREIGN PATENT DOCUMENTS

| | | |
|---|---|---|
| DE | 100 10 638 | 9/2001 |
| DE | 100 10 638 A1 | 9/2001 |
| DE | 100 20 464 A1 | 11/2001 |
| DE | 100 26 254 A1 | 11/2001 |
| DE | 297 24 582 U1 | 8/2002 |
| DE | 102 34 977 A1 | 2/2004 |
| DE | 102 45 628 A1 | 4/2004 |
| EP | 0 933 823 A2 | 1/1999 |
| EP | 1 081 771 A | 3/2001 |
| JP | 55 070080 A | 5/1980 |
| JP | 55 113387 A | 9/1980 |
| JP | 03-017656 | 1/1991 |
| JP | 03 017656 U | 2/1991 |
| JP | 07-162037 | 6/1995 |
| JP | 07-220181 | 8/1995 |
| JP | 11 087779 A | 6/1999 |
| JP | 11 161197 A | 6/1999 |
| JP | 11-284234 | 10/1999 |
| JP | 2000 299 396 A | 10/2000 |
| JP | 20020 252372 A | 9/2002 |
| JP | 2002 359403 | 12/2002 |
| WO | WO 98/12757 | 3/1998 |
| WO | WO 01/39282 A2 | 5/2001 |
| WO | WO 01/61764 A1 | 8/2001 |
| WO | WO 02/13281 A1 | 2/2002 |

OTHER PUBLICATIONS

I. Schnitzer, et al., "30% external quantum efficiency from surface textured, thin-film light-emitting diode", Appl. Phys. Lett,. vol. 63, No. 16, pp. 2174-2176, Oct. 18, 1993.

Office Action dated Jun. 29, 2007 issued for the corresponding Chinese Patent Application No. 200480005482.4.

Office Action dated Aug. 20, 2007 issued for the corresponding European Patent Application No. 04 702 280.1.

* cited by examiner

LIGHTING MODULE AND METHOD FOR THE PRODUCTION THEREOF

RELATED APPLICATIONS

This is a U.S. national stage of application No. PCT/DE2004/000040, filed on Jan. 15, 2004.

This patent application claims the priority of German patent application 103 08 866.0 filed Feb. 28, 2003, the disclosure content of which is hereby incorporated by reference.

FIELD OF THE INVENTION

The invention relates to an illumination module with at least one light source. The invention furthermore relates to a method for producing such an illumination module.

BACKGROUND OF THE INVENTION

One possible type of such an illumination module is described in published U.S. patent application No. 2001/045573, for example. This involves a light emitting diode chip being fixed on a leadframe and surrounded by a housing, so that the light coupling-out areas of the light emitting diode chip adjoin a gaseous atmosphere. Such a design affords the possibility, in particular, of using housing materials which do not experience aging under the influence of UV radiation and/or whose coefficient of thermal expansion is adapted to that of the leadframe. One disadvantage of such a semiconductor component is that electromagnetic radiation of the light emitting diode chip is coupled out directly toward air or toward a gas. On account of the generally relatively high refractive index of semiconductor materials, a large part of the light intensity is lost in this case as a result of internal reflection, in particular as a result of more frustrated total interval reflection ("frustrated reflection") at the semiconductor/gas atmosphere interface. Since housings of this type, for protecting the light emitting diode chip, generally also have a covering, a further part of the light intensity is lost as a result of reflections at interfaces of said covering.

In order to achieve an improved coupling-out of light, light emitting diode chips are generally encapsulated with a light-transmissive potting or encapsulating material having a highest possible refractive index in such a way that, in particular, all light coupling-out areas of the light emitting diode chip are covered with said material. One example of such a component is described in Möllmer/Waitl, "Siemens SMT-TOPLED für die Oberflächenmontage" [Siemens SMT-TOPLED for surface mounting], Part 1: Properties and special features (Siemens Components 29 (1991), issue 4). Such a so-called TOPLED has a surface-mountable housing. The potting or encapsulating material that envelops the light emitting diode chip is generally an epoxy resin, which has an essentially planar coupling-out area in the case of a TOPLED. By virtue of its relatively high refractive index with respect to air, the epoxy resin effects an improved coupling-out of light from the light emitting diode chip and thus also an overall improved coupling-out of light to the surroundings. In addition, the coupling-out area of the potting or encapsulating material may have the form of a lens, whereby the light coupling-out efficiency is increased further. As an alternative, a separate lens may be applied to the potting or encapsulating material in the emission direction of the component.

One disadvantage of these designs is that, with the use of light emitting diode chips having a relatively short emission wavelength, in particular in the case of light emitting diode chips that emit in the UV range, they experience severe degradation on account of aging of the potting or encapsulating material having a high refractive index as a result of the electromagnetic radiation emitted by the light emitting diode chip. A further disadvantage is that such potting or encapsulating materials have greatly different coefficients of thermal expansion compared with semiconductor materials of light emitting diode chips, thus resulting in a limitation of the quantity of material and hence a limitation of the size of the component. Moreover, encapsulating light emitting diode chips with potting or encapsulating material is relatively expensive and can make up almost 50% of the total production costs for example in the case of a TOPLED.

SUMMARY OF THE INVENTION

It is an object of the present invention to provide a simpler and more readily producible form of a light emitting semiconductor component which has improved light coupling-out efficiency. Moreover, the semiconductor component is intended to permit the use of light emitting diode chips that emit in the UV range, and not to have any restriction with regard to the number of light emitting diode chips.

This and other objects are attained in accordance with one aspect of the invention directed to a light emitting semiconductor component of the type mentioned in the introduction has at least one light emitting diode chip which is applied on a chip carrier having electrical connecting conductors. In this case, the light emitting diode chip is a thin-film light emitting diode chip having a first and a second electrical connection side and also an fabricated semiconductor layer sequence. The semiconductor layer sequence contains an n-conducting semiconductor layer, a p-conducting semiconductor layer and an electromagnetic radiation generating region arranged between these two semiconductor layers, is arranged on a carrier and has a reflective layer at a main area facing toward the carrier, which reflective layer reflects at least one part of the electromagnetic radiation generated in the semiconductor layer sequence back into the latter. Moreover, the semiconductor layer sequence has at least one semiconductor layer with at least one micropatterned rough area, and also a coupling-out area essentially defined by a main area remote from the reflective layer. Also, the coupling-out area of the thin-film light emitting diode chip is free of housing material such as potting or encapsulating material.

With a thin-film light emitting diode chip constructed as described just above, it was possible to achieve a coupling-out efficiency of more than 50% when coupling out light from the semiconductor toward air. Moreover, it was observed that the coupling-out efficiency can be reduced if the thin-film light emitting diode chip is provided with epoxy resin potting like a conventional light emitting diode chip (not thin-film light emitting diode chip) in a TOPLED housing. Upon incorporating the thin-film light emitting diode chip into a different housing with an epoxy resin potting, the latter having a coupling-out area formed in lens-type fashion, although an increase in the light coupling-out efficiency was observed, it is very low compared with conventional types of light emitting diode chips incorporated into such a housing.

Figure 1:
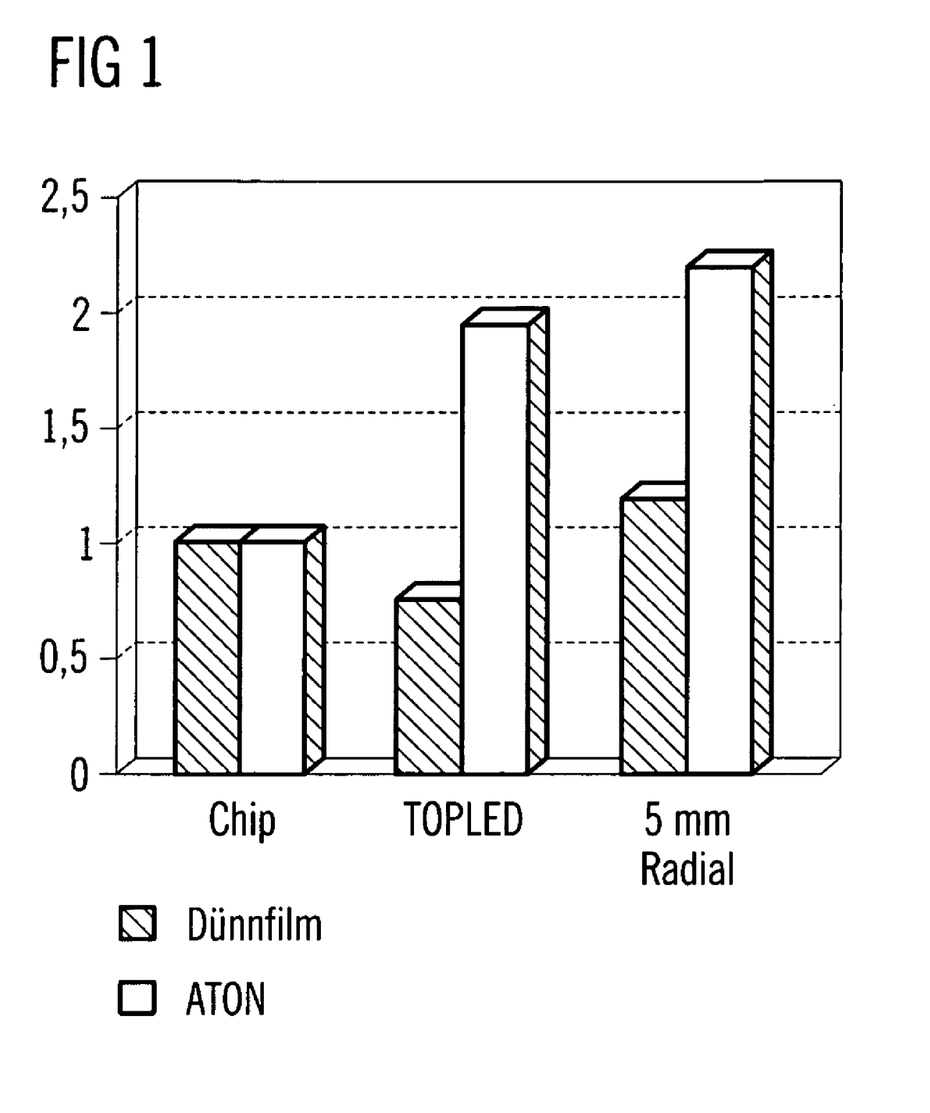
FIG. 1 is a graph showing the coupling-out efficiency of a thin-film light emitting diode chip and an ATON light-emitting diode chip.

The results of such measurements are summarized graphically in the diagram of FIG. 1. This shows in each case the coupling-out efficiency (plotted on the y axis) of a thin-film light emitting diode chip (dark bars) and a so-called ATON light emitting diode chip (light bars) in three different housing designs (plotted along the x axis). It is characteristic of an ATON light emitting diode chip that a substantial part of the radiation emitted by the chip is coupled out from the chip through the substrate. Examples of such a chip are specified in U.S. Pat. No. 6,730,939. The coupling-out efficiency of the potted chips is plotted relative to the coupling-out efficiency of the respective light emitting diode chips toward air, which is in each case normalized with 1.

The first design does not have any potting, that is to say that the coupling-out from the light emitting diode chip takes place directly toward air here, so that the relative coupling-out efficiency produces the norm or 1 as per the definition of both types of light emitting diode chip, but this does not mean that the examined thin-film chip and the examined ATON chip have the same coupling-out efficiency, seen in absolute terms.

The second design is a TOPLED housing with an epoxy resin potting having a planar coupling-out area. While the coupling-out efficiency is increased by almost 100% as a result of an ATON light emitting diode chip being incorporated into such a housing, it is reduced by about 20% in the case of a thin-film light emitting diode as a result of incorporation into the housing.

In the case of the third design, finally, which has a conventional radial LED housing with an epoxy resin potting with a coupling-out area formed in lens-type fashion, an improvement in the coupling-out efficiency of more than 100% is achieved in the case of an ATON light emitting diode chip, while although an improvement in the coupling-out efficiency is also observed in the case of the thin-film light emitting diode chip used, it amounts to only approximately 20%.

One possible interpretation of these observations is that light emitted by a light emitting diode chip experiences an intensity loss during the transition from the epoxy resin to air, while it experiences an intensity gain during the transition from the semiconductor to the epoxy resin, compared with the transition from the semiconductor to air. The intensity loss is primarily attributable to the reflection of the light at the epoxy resin/air interface and also to absorption of the light in the epoxy resin, while the intensity gain occurs on account of the higher refractive index of the epoxy resin and the reduced reflection as a result. The intensity gain as a result of the coupling-out into the potting in the case of conventional light emitting diode chips is evidently so large that it far overcompensates for the intensity loss during the coupling-out from the potting, while the intensity gain in the case of a thin-film light emitting diode chip may be so low that the intensity loss predominates or is only slightly overcompensated, depending on the housing design.

Thin-film light emitting diode chips of this type are described for example in I. Schnitzer et al., Appl. Phys. Lett. 63 (16), Oct. 18, 1993, 2174-2176, the disclosure content of which is in this respect hereby incorporated by reference. Further thin-film light emitting diode chips and methods for producing them are described in published U.S. patent application No. 2002,017652, pending U.S. applicaton No. 10/523,551, and German patent application no. 10305100.7, and also in published U.S. patent application No. 2004/0113167, the content of all of which is hereby incorporated by reference.

A light emitting semiconductor component according to the invention has a light coupling-out efficiency comparable with that of conventional components in which the light emitting diode chip is enveloped by a potting or encapsulating material. At the same time, production can be carried out more simply and more cost-effectively compared with components of this type.

The semiconductor layer sequence preferably has at least one material from the system $In_xAl_yGa_{1-x-y}N$ where $0 \leq x \leq 1$, $0 \leq y \leq 1$ and $x+y \leq 1$.

The invention can be used particularly advantageously in the case of semiconductor layer sequences that generate electromagnetic radiation having a wavelength in the UV range. By virtue of the fact that the coupling-out area of the thin-film light emitting diode chip is free of housing material having a high refractive index, such as potting or encapsulating material, all materials of the semiconductor component can be chosen without any essential disadvantage in such a way that they experience no or only slight aging under the influence of UV radiation.

The coupling-out area of the thin-film light emitting diode chip advantageously adjoins a region which is filled with a gas and/or provided with a vacuum.

In one preferred embodiment of the semiconductor component, the carrier on which the fabricated semiconductor layer sequence is arranged is a separately produced carrier substrate that is connected to the semiconductor layer sequence after the growth of the latter, in particular a semiconductor carrier substrate. Such a carrier substrate is required on account of the particular production method for thin-film light emitting diodes, in the case of which a growth substrate is removed at least for the most part from the semiconductor layer sequence, in order to uncover or produce the coupling-out area of the thin-film light emitting diode chip.

As an alternative, it is also advantageously possible to dispense with a separate carrier substrate, in which case the chip carrier of the semiconductor component then performs the function of the carrier for the semiconductor layer sequence. The height of the semiconductor component can thereby be reduced.

In one advantageous embodiment of the semiconductor component, the latter has a housing frame, which is arranged on the chip carrier or on a housing bottom which is different therefrom and has electrical connecting conductors, and which defines with this a housing cavity in which the thin-film light emitting diode chip is arranged. For the case where the housing frame is arranged on a housing bottom, the chip carrier is applied on said housing bottom and is also electrically connected to the connecting conductors of the housing bottom.

Preferably, the housing cavity is defined by a leadframe around which a housing basic body is formed, the bottom of the housing basic body with the part of the leadframe integrated therein forming the chip carrier or the housing bottom. In this case, the housing basic body is essentially composed of plastic.

As an alternative, the chip carrier or the housing bottom is a printed circuit board which has a metal plate which preferably contains copper and which is both electrically and thermally conductively connected to the first electrical connection side of the thin-film light emitting diode chip. The metal plate may be used both for the electrical connection of the thin-film light emitting diode chip and for dissipating heat generated in the thin-film light emitting diode chip.

Inner walls of the housing cavity are advantageously at least partly provided with a layer, preferably with a metallic or oxidic layer, particularly preferably with a layer having $TiO_2$, Ag, Al or Au, which is reflective for an electromagnetic radiation generated in the semi-conductor component. Such a reflective layer may first of all serve for better coupling-out of light from the semiconductor component, and may additionally be used as protection of material of the housing cavity against the electromagnetic radiation, which is advantageous particularly if the thin-film light emitting diode chip emits UV radiation and the housing has plastic that ages under the influence of UV radiation.

In a particularly advantageous manner, the reflective layer is electrically conductive and is additionally electrically conductively connected to the second electrical connection side of the thin-film light emitting diode chip. Consequently, the reflective layer may additionally be used as an electrical connecting conductor of the thin-film light emitting diode chip.

In another advantageous refinement, inner walls of the housing cavity are at least partly provided with a diffusor material. For the case where the inner walls of the housing cavity are provided with a reflective layer, the diffusor material may expediently be applied thereto. As an alternative or in addition, the inner walls of the housing cavity may also be provided with a layer that is diffusely reflective for an electromagnetic radiation generated in the semiconductor component, particularly when a further reflective layer is not present.

The housing cavity is advantageously closed off in gastight and/or watertight fashion.

In one particularly preferred embodiment of the semiconductor component, the latter has a radiation-transmissive covering plate fitted in such a way that it essentially covers and/or closes the opening of the housing cavity. This serves e.g. as protection of the thin-film light emitting diode chip against external mechanical or chemical influences.

The covering plate is advantageously shaped at least in such a way that it has an optical device for the beam shaping of an electromagnetic radiation emitted by the semiconductor component, preferably a focussing apparatus.

Preferably, the covering plate essentially comprises at least one of the materials glass, quartz glass, ceramic or glass ceramic.

The covering plate may advantageously be provided with a diffusor material which is contained in the covering plate and additionally or alternatively is applied on the covering plate.

In one particularly preferred embodiment of the semiconductor component, at least one main area of the covering plate, preferably the main area of the covering plate that faces the interior of the housing cavity, has a rough structure. As a result, it is possible to reduce light intensity losses on account of reflection at interfaces of the covering plate, in particular on account of frustrated reflection. For this purpose, it is advantageous if the rough structure of the main area of the covering plate is formed in irregular fashion.

In one preferred embodiment, the rough structure of the main area of the covering plate has a multiplicity of partial areas which are oblique with respect to a main plane of extent of the semiconductor layer sequence and form a multiplicity of different angles with the latter. The partial areas are distributed statistically over the entire main area in particular with regard to said angles. If an electromagnetic beam is reflected at such a patterned area, the probability of a frustrated reflection is low since the beam, upon impinging on the area again, will with high probability impinge on a partial area of the patterned area at a different angle of incidence than on the preceding occasion, thereby increasing the probability for the coupling-out of such an electromagnetic beam from the housing.

The rough structure of the main area of the covering plate particularly preferably has a structure size which is of the order of magnitude of the wavelength of an electromagnetic radiation emitted by the semiconductor component.

In one particularly advantageous embodiment of the semiconductor component, a luminescence conversion material is arranged downstream of the thin-film light emitting diode in the emission direction, which material wavelength-converts at least one part of an electromagnetic radiation emitted by the thin-film light emitting diode, that is to say which absorbs said radiation and thereupon emits radiation having a different wavelength. A resulting, preferably optically perceptible radiation of the semiconductor component is produced by a mixing of the wavelength-converted radiation with the radiation emitted by the thin-film light emitting diode, so that in particular white light can also be generated as a result. The radiation emitted by the thin-film light emitting diode chip may also be essentially completely wavelength-converted by the luminescence conversion material, if desired.

The luminescence conversion material preferably has at least two phosphors that differ with regard to conversion properties and/or particle size.

At least one part of the luminescence conversion material is advantageously admixed with the covering plate. In addition or as an alternative, at least one part of the luminescence conversion material is advantageously applied at least to one main area of the covering plate. Preferably this is a main area of the covering plate that faces the interior of the housing cavity.

In a further embodiment, at least one part of the luminescence conversion material is preferably applied to the coupling-out area of the thin-film light emitting diode chip. This is advantageous particularly when the semiconductor component does not have a covering plate.

The luminescence conversion material is applied to the main area of the covering plate and/or the coupling-out area of the thin-film light emitting diode chip preferably in the form of a converter layer whose surface has a rough structure. Such a structure makes it possible to increase the radiation coupling-out efficiency of the semiconductor component.

In this case, the rough structure of the converter layer is particularly preferably irregular.

In a particularly advantageous manner, the rough structure of the converter layer has a multiplicity of partial areas which are oblique with respect to a main plane of extent of the semiconductor layer sequence and form a multiplicity of different angles with the latter. The partial areas of the rough structure are distributed statistically over the entire converter layer in particular with regard to said angles.

In one preferred embodiment of the semiconductor component, the converter layer has a multiplicity of crystallites, and the rough structure of the converter layer is essentially defined directly or indirectly by the form of the crystallites.

In a particularly advantageous manner, the rough structure of the converter layer has a structure size which is of the order of magnitude of the wavelength of an electromagnetic radiation emitted by the semiconductor component.

In a further preferred embodiment of the semiconductor component, the latter has at least two and preferably three types of thin-film light emitting diode chips. The latter emit visible light in each case having a different wavelength, which is mixed and produces light of a specific color locus in the CIE diagram, in particular white light. In this case, at least one of the types of thin-film light emitting diode chips preferably has at least one material from the system $In_xGa_yA_{1-x-y}P$ where $0 \leq x \leq 1$, $0 \leq y \leq 1$ and $x+y \leq 1$.

The thin-film light emitting diode chip advantageously has a thickness of between 0 and 100 μm inclusive, preferably between 0 and 50 μm inclusive, particularly preferably between 0 and 10 μm inclusive.

In one particularly advantageous embodiment of the light emitting semiconductor component, the latter has, between at least one electrical connection side of the thin-film light emitting diode chip and an electrical connecting conductor of the chip carrier, an electrical connecting line which essentially comprises a layer of electrically conductive, radiation-transmissive material. In particular the front side of the thin-film light emitting diode chip, that is to say the side facing toward the emission direction of the thin-film light emitting diode chip, is electrically connected by means of a material of this type, so that the semiconductor component does not have a bonding wire that is otherwise generally used for this purpose. As a result, the structural height of the semiconductor component can be reduced. Moreover, the thin-film light emitting diode chip thereby becomes less susceptible to external mechanical influences. A further advantage is that a bonding pad can be dispensed with, thus resulting in a larger radiation emitting area.

The electrically conductive, radiation-transmissive material preferably has at least one transparent electrically conducting oxide (TCO), preferably indium tin oxide (ITO) or zinc oxide (ZnO).

Such an electrical connecting line made of a layer of electrically conductive, radiation-transmissive material is not restricted in its application to a semiconductor component according to the invention. Rather, it is suitable for light emitting semiconductor components with arbitrary semiconductor-based light sources and also for semiconductor components in which coupling-out areas of light sources are covered by potting or encapsulating material. Moreover, this technology is suitable for all optoelectronic components in which an electrically conductive connection is required between a free semiconductor area and an electrical connecting conductor, in particular when electromagnetic radiation is emitted and/or received via the semiconductor area. The same holds true for the method for producing such an electrical connecting line as explained below.

Another aspect of the invention is directed to a method for producing a light emitting semiconductor component comprises providing at least one thin-film light emitting diode chip with a first and a second electrical connection side, and a chip carrier with at least one first and at least one second electrical connecting conductor. Afterward, the thin-film light emitting diode chip is applied to the chip carrier and the first electrical connection side is electrically connected to the first electrical connecting conductor of the chip carrier. A further method step involves coating at least all electrically conductive free areas which are not intended to be electrically connected to the second electrical connection side of the thin-film light emitting diode chip with electrically insulating material. In particular free areas of the first connecting conductor and also side edges of the thin-film light emitting diode chip are coated with this electrically insulating material. Furthermore, an electrical connection between the second electrical connection side of the thin-film light emitting diode chip and the second connecting conductor is produced by means of whole-area coating of the chip carrier and the thin-film light emitting diode chip with an electrically conductive, radiation-transmissive material. This is followed by heat treatment of the thin-film light emitting diode chip with the applied materials.

Such a method is suitable in particular for making electrical contact with particularly thin light emitting diode chips, for example having a thickness of less than 10 µm. Such light emitting diodes cannot be electrically conductively connected by means of a bonding wire since they break easily in the case of this generally used method.

In one preferred embodiment of the method, the first electrical connection side can be contact-connected on the rear side of the thin-film light emitting diode chip, and the application of the thin-film light emitting diode chip to the chip carrier and the electrical connection of the first electrical connection side to the first electrical connecting conductor take place simultaneously by means of soldering or adhesively bonding the thin-film light emitting diode chip onto the first electrical connecting conductor by the rear side of said chip.

Preferably, prior to the method step of producing an electrical connection between the second electrical connection side of the thin-film light emitting diode chip and the second connecting conductor, electrical contact material is applied to an area via which the second electrical connection side can be electrically contact-connected. This may be necessary for forming an electrical contact with a sufficiently good electrical conductivity.

In a particularly advantageous embodiment of the method, the electrical contact material is applied as a thin layer, in the form of narrow strips or in the form of a plurality of layers restricted to small partial regions. This makes it possible to effect the introduction of electric current into the thin-film light emitting diode chip uniformly over a large, preferably over the entire main area of the latter.

The coating with the electrically insulating material takes place by said material firstly being applied to the chip carrier and the thin-film light emitting diode chip and subsequently being patterned, preferably by means of lithography, in such a way that the area via which the second electrical connection side can be electrically contact-connected and also the second electrical connecting conductor are at least partly uncovered for electrical connection.

As an alternative, the coating with the electrically insulating material takes place by means of screen printing in one preferred embodiment of the method.

In a particularly advantageous manner, the electrically insulating material substantially comprises soldering resist.

In addition or as an alternative, the electrically insulating material advantageously has $SiO_2$.

Particularly preferably, in the case of the method, a multiplicity of light emitting semiconductor components are produced essentially simultaneously. This is done using a chip carrier having a plurality of device sections each containing at least one first and at least one second electrical connecting conductor. The semiconductor components are subsequently singulated. In particular with regard to the production of an electrical connection between the second electrical connection side of the thin-film light emitting diode chip and the second connecting conductor, an essentially simultaneous production of a multiplicity of semiconductor components can be carried out simply and cost-effectively since this essentially comprises coating the chip carrier and the thin-film light emitting diode chip, which is possible without significant additional outlay even in the case of relatively large areas.

In one advantageous embodiment of the method, the device sections are arranged in rowlike fashion in at least one row.

The individual rows are preferably separated from one another by slots in the chip carrier.

BRIEF DESCRIPTION OF THE DRAWINGS

FIG. 4b shows a schematic plan view of the exemplary embodiment shown in FIG. 4a, FIG. 4c shows a polar diagram for illustrating a distribution of the light intensity as a function of the emission angle of the semiconductor component shown in FIGS. 4a and 4b for a varying number of thin-film light emitting diodes.

DETAILED DESCRIPTION OF THE DRAWINGS

Identical or identically acting constituent parts are in each case provided with the same reference symbols in the exemplary embodiments and figures. The layer thicknesses illustrated are not to be regarded as true to scale; rather, they are illustrated with an exaggerated thickness for the sake of a better understanding. Structure sizes are likewise not illustrated with the correct scale or size relationship with respect to other elements in the figures.

Figure 2A:
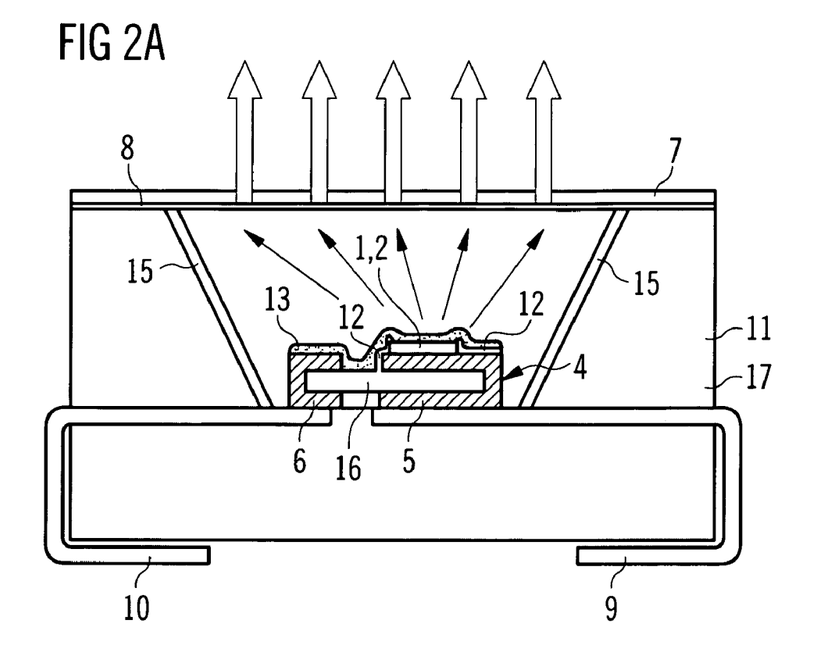
FIGS. 2a and 2b show a schematic sectional view each of an exemplary embodiment of the semiconductor component according to an embodiment of the invention.

In the case of the exemplary embodiment shown in FIG. 2a, a thin-film light emitting diode chip 1 applied on a chip carrier 4 is mounted, by means of the chip carrier 4, onto a leadframe 9, 10 around which a housing basic body 11 is formed. The chip carrier has a first and a second electrical connecting lead 5,6, which are applied on a carrier plate 16 and electrically conductively connected to the connections of the leadframe 9, 10, for example by being soldered on or adhesively bonded on. The carrier plate 16 is configured in such a way that the connecting conductors 5, 6 are electrically insulated from one another. It may for example comprise a ceramic such as $Al_2O_3$.

That part of the housing basic body 11 which forms the housing frame 17 has inner walls covered with a reflective layer 15. The reflective layer is reflective in particular for an electromagnetic radiation generated in the semiconductor component and may comprise aluminum, by way of example.

The housing basic body 11 comprises e.g. a plastic, for example an epoxy resin, and is covered with a covering plate 7, which is transparent at least to a radiation generated in the semiconductor component and is produced from glass, for example. The housing basic body 11 can be closed off in gastight and/or watertight fashion by means of the covering plate 7. A luminescence conversion material in the form of a converter layer 8 is applied on a main area of the covering plate 7 that faces the interior side of the housing basic body 11. The surface of the converter layer has an irregular rough structure with a multiplicity of partial areas (not shown) which are oblique with respect to the main plane of extent of the thin-film light emitting diode chip 1 and form a multiplicity of different angles with said plane. The partial areas are distributed statistically over the entire surface of the converter layer 8 primarily with regard to said angles. The converter layer contains for example phosphor particles based on YAG: Ce or other suitable inorganic phosphor particles such as are described in U.S. Pat. No. 6,060,861, for example, the content of which in this respect is hereby incorporated by reference.

The main area of the covering plate 7 which is remote from the interior side of the housing basic body 11 may be formed as an optical lens (not shown).

The rough structure of the converter layer is defined for example by the form of a multiplicity of irregularly shaped crystallites which are the form in which the luminescence conversion material may be present. As an alternative or in addition, it is possible for the main area of the covering plate 7 that faces the interior side of the housing basic body 11 also to have a rough irregular structure of this type. The structure size of these rough structures is of the order of magnitude of the wavelength of an electromagnetic radiation emitted by the semiconductor component, e.g. approximately 300 to 500 nm. Such a structure has the effect that light beams which impinge and are reflected at a certain angle at a partial area of the respective surface, upon impinging on this surface again, will with high probability impinge on a different partial area at a different angle, so that the conditions for a transmission are met under certain circumstances. Consequently, light intensity losses in the semiconductor component on account of frustrated reflection can be reduced and a better coupling-out of light can effectively be achieved.

The luminescence conversion material of the converter layer absorbs at least one part of an electromagnetic radiation (indicated by the solid arrows) emitted by the thin-film light emitting diode 1 and having a specific wavelength, and thereupon emits a radiation having at least one wavelength that is different therefrom, generally higher. The different radiations are intermixed and produce light of a specific color point in the CIE chromaticity diagram, in particular white light (indicated by the arrows that are not filled in). In order to obtain good intermixing of the different radiations, the covering plate may be provided with a diffusor material, which may be contained in the covering plate or be applied on the latter. Moreover, the reflective layer 15 may also be provided with a diffusor or comprise a diffusely reflective material.

The thin-film light emitting diode chip 1, which may be configured in the manner described in the general part of the description, comprises a semiconductor layer sequence 2, which is applied to the first electrical connecting conductor 5 of the chip carrier 4 directly, for example by means of soldering or adhesive bonding. As a result, a first electrical connection side of the thin-film light emitting diode chip 1 is additionally electroconductively connected to the first electrical connecting conductor 5. The thickness of the semiconductor layer sequence may be 8 μm, by way of example.

Such a semiconductor layer sequence may have for example a conventional pn junction, a double hetero-structure, a single quantum well structure (SQW structure) or a multiple quantum well structure (MQW structure). Such structures are known to the person skilled in the art and are therefore not explained in any greater detail at this juncture. One example of a multiple quantum well structure based on GaN is described in U.S. Pat. No. 6,849,881, the disclosure content of which is in this respect hereby incorporated by reference.

The semiconductor layer sequence 2 of the thin-film light emitting diode 1 contains for example at least one material from the system $In_xAl_yGa_{1-x-y}N$ where $0 \leq x \leq 1$, $0 \leq y \leq 1$ and $x+y \leq 1$, and emits an electromagnetic radiation whose wavelength lies in the UV range. The thin-film light emitting diode 1 may be an InGaN-based light emitting diode, by way of example. In this case, the radiation is almost completely absorbed by the converter layer and converted by two or more different phosphors. One advantage of the use of a thin-film light emitting diode 1 that emits in the UV range and the almost complete conversion of a radiation emerging from said diode into visible light is that a light emitted by phosphors generally has a broader spectrum than a light emitted by light emitting diodes. Consequently, it is possible for example to generate white light with better color rendering (color rendering index).

The second electrical connection side of the thin-film light emitting diode chip 1 can be contact-connected via the front side thereof. It is electrically conductively connected to the second connecting conductor 6 of the chip carrier 4 by means of an electrically conductive, radiation-transmissive material 13. In order to avoid an electrically conductive connection between the first and second connecting conductors (5, 6), free areas of the first connecting conductor 5 and also the side edges of the thin-film light emitting diode chip 1 are covered with electrically insulating material 12.

The electrically conductive, radiation-transmissive material 13 may be for example a transparent electrically conducting oxide (TCO), such as, for instance, indium tin oxide (ITO), or zinc oxide (ZnO). The electrically insulating material 12 comprises for example soldering resist or a material having $SiO_2$.

Figure 2B:
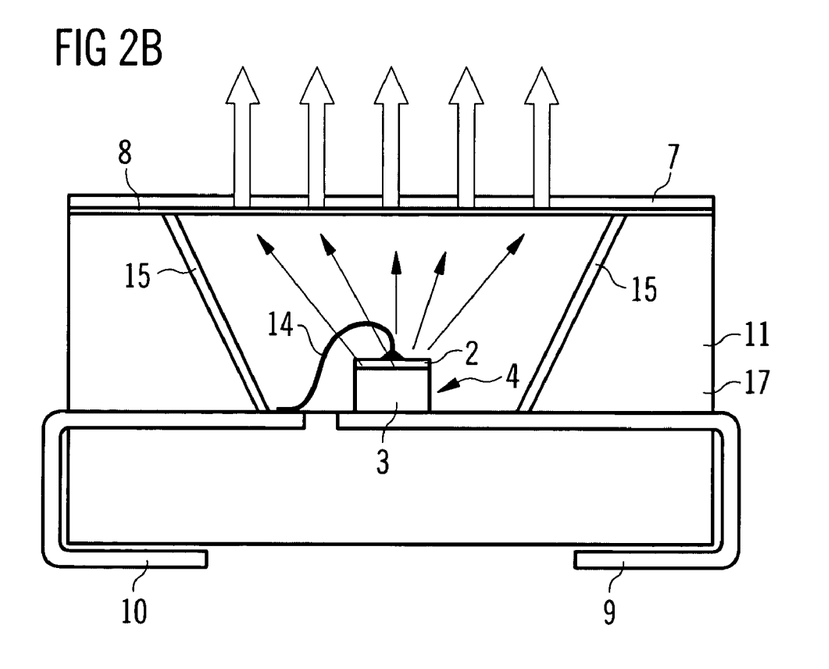

The exemplary embodiment shown in FIG. 2B differs from the exemplary embodiment explained above with reference to FIG. 2A by virtue of the carrier of the semiconductor layer sequence 2 of the thin-film light emitting diode chip 1 and also by the way in which the thin-film light emitting diode chip 1 is electrically connected to the electrical connecting conductors 9, 10 of the leadframe.

In accordance with the second exemplary embodiment, the carrier for the semiconductor layer sequence 2 is a separately produced semiconductor carrier substrate 3 which is applied to the first electrically connecting conductor 9, e.g. soldered on, by its rear side. As a result, the first electrical connection side of the thin-film light emitting diode chip 1 is also electrically conductively connected to the first electrical connecting conductor 9. The second electrical connection side is electrically conductively connected to the second electrical connecting conductor 10 via the front side of the semiconductor layer sequence 2 by means of a bonding wire 14. Consequently, the coupling-out area, that is to say the main area of the thin-film light emitting diode chip 1 which faces toward the emission direction, is essentially uncovered and adjoins a region which may be filled with a gas, e.g. with air, and additionally be provided with a vacuum.

In the case of the exemplary embodiments shown in FIGS. 2A and 2B, luminescence conversion material may additionally or alternatively also be applied directly to the light coupling-out area of the thin-film light emitting diode chip 1 or to the electrically conductive, radiation-transmissive material 13 or else be contained in the material of the covering plate. Moreover, the luminescence conversion material may have various phosphors having different particle sizes. A further possibility is a component without luminescence conversion material, the thin-film light emitting diode of which then preferably emits radiation from a visible wavelength range. It is also possible for the component not to have a covering plate.

Instead of one thin-film light emitting diode chip, the component may also have a plurality thereof, which, moreover, may be different with regard to the emission spectrum, so that the radiations of different wavelengths are mixed to form mixed-color light. Such light emitting diodes emit radiation from the visible wavelength range and have e.g. at least one material from the system $In_xGa_yAl_{1-x-y}P$ where $0 \leq x \leq 1$, $0 \leq y \leq 1$ and $x+y \leq 1$.

Figure 3A:
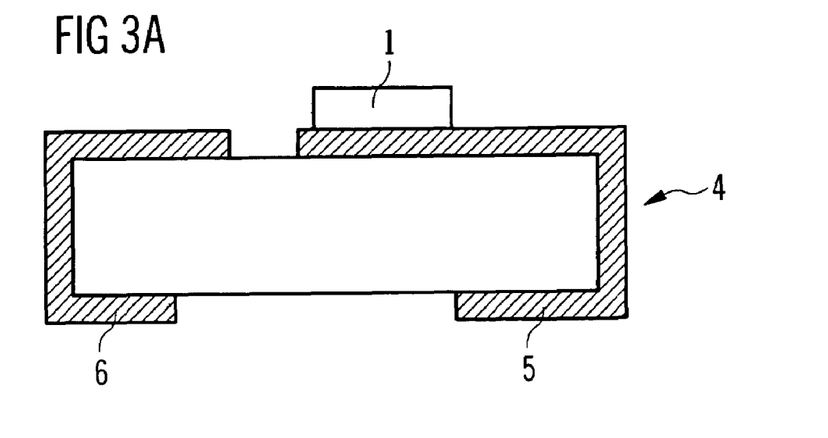
FIGS. 3a to 3c show schematic sectional views of an exemplary embodiment of the semiconductor component according to the invention at different method stages of an exemplary embodiment of the method according to the invention.
Figure 3B:
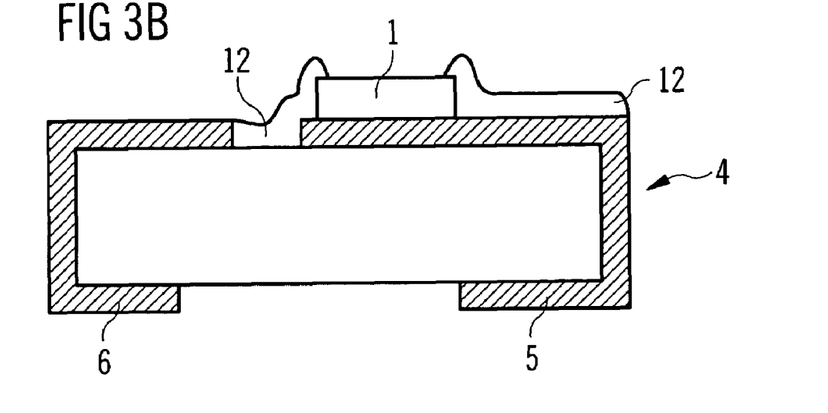
Figure 3C:
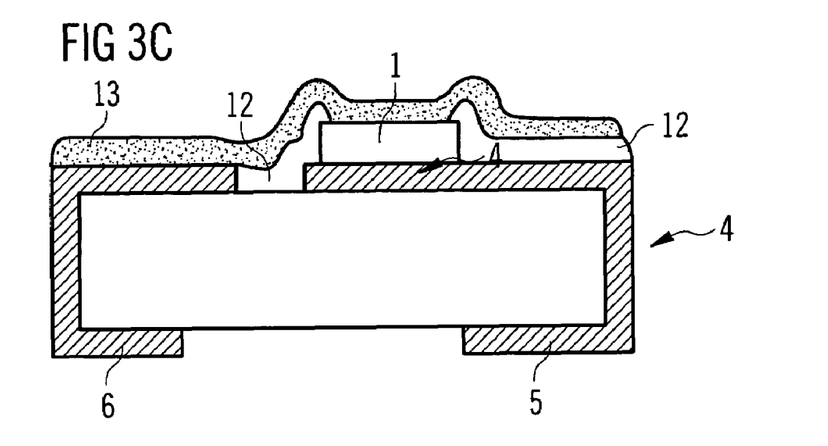

FIGS. 3A to 3C show schematic sectional views of an exemplary embodiment of the semiconductor component at different method stages for producing said semi-conductor component. The semiconductor component corresponds to the chip carrier 4 shown in FIG. 2A with the thin-film light emitting diode chip 1 applied thereon and electrically connected to the electrical connecting conductors 5, 6 thereof. In the example shown in FIG. 2A, the chip carrier is mounted onto a leadframe 9, 10 around which a housing basic body 11 is formed. However, the possibility for use is of course not restricted to such a design.

The thin-film light emitting diode chip 1 is applied to the first connecting conductor 5 of the chip carrier 4 by its rear side and is electrically conductively connected to the connecting conductor 5, for example by means of soldering or adhesive bonding. The method stage shown in FIG. 3A corresponds to a state reached as a result of this.

Afterward, at least all free areas which are not intended to be electrically conductively connected to the second electrical connecting conductor 6 are covered with an electrically insulating material 12. This may be done either by means of a lithographic process or else in a step by means of screen printing, both of which are possible using soldering resist, by way of example. In the example of FIG. 3B, this corresponds to the covering of all free areas of the first connecting conductor 5 and also the side edges of the thin-film light emitting diode chip 1.

In order to produce an electrically conductive connection between the second electrical connection side of the thin-film light emitting diode chip 1 and the second electrical connecting conductor 6, the surface of the chip carrier 4 and of the light emitting diode chip 1 is coated over the whole area with an electrically conductive, transparent material 13, this being done by means of a coating method which is suitable for this purpose and is known to the person skilled in the art (see FIG. 3C). Prior to cutting, electrical contact material may be applied (not shown) to that area of the light emitting diode chip 1 via which the latter's second electrical connection side can be electrically contact-connected. This may be gold, for example, which is applied for instance in the form of a thin layer that is transmissive to electromagnetic radiation.

Figure 5:
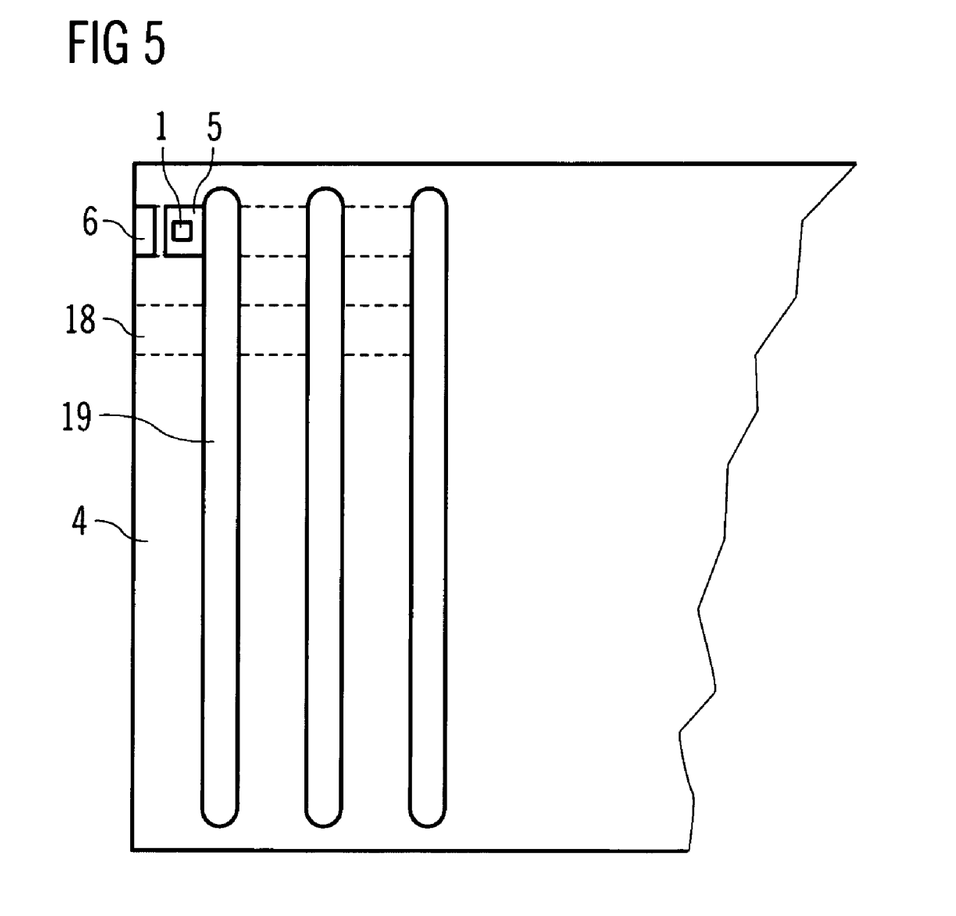
FIG. 5 shows a schematic plan view of a chip carrier with a multiplicity of device sections.

The method is very well suited to producing a plurality of components essentially simultaneously. For this purpose, the chip carrier 4 may have a multiplicity of device sections 18 each having at least one first and one second electrical connecting conductor 5, 6, as illustrated schematically in FIG. 5. In this case, the device sections are arranged in row form and individual rows are separated from one another by slots 19. The components are subsequently singulated, but may also be singulated at an arbitrary earlier point in time or else already be singulated before the method.

A device section may also have a plurality of thin-film light emitting diodes (see FIGS. 4A and 4B), which can likewise be electrically connected to at least one connecting conductor in each case essentially simultaneously by means of a method of this type, as an alternative to the bonding wires shown in the figure. If, in the case of a thin-film light emitting diode chip, both electrical connection sides can in each case be electrically contact-connected via a semiconductor area on the front side, then both connection sides can be electrically conductively connected to the respective connecting conductor by said method.

Figure 4A:
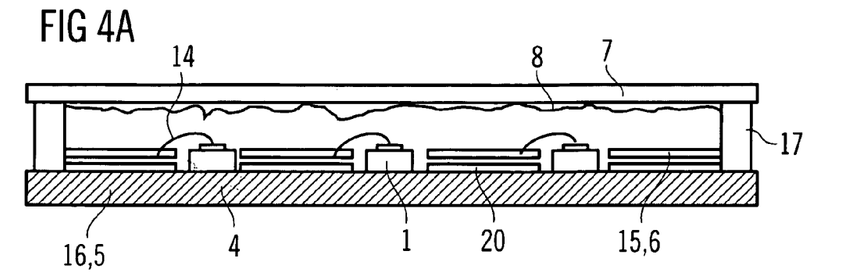
FIG. 4a shows a schematic sectional view of a further exemplary embodiment of the semiconductor component.
Figure 4B:
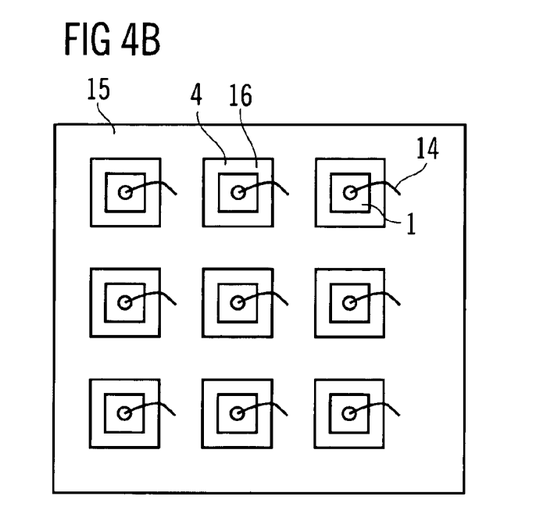

In the exemplary embodiment shown in FIGS. 4A and 4B, a multiplicity of thin-film light emitting diode chips 1 are applied on a common chip carrier 4. The carrier plate 16 of the chip carrier 4 comprises electrically and thermally conductive material, for example copper, to which the light emitting diode chips 1 are in each case electrically and thermally conductively connected by their rear side. Consequently, the carrier plate serves as a first electrical connecting conductor 5 and as a heat sink into which heat generated by the light emitting diode chip 1 during operation thereof is dissipated. The second electrical connection side of the thin-film light emitting diode chip 1 is in each case electrically conductively connected to a reflective layer 15, which likewise comprises electrically conductive material, e.g. aluminum, and additionally serves as a second electrical connecting conductor 6.

The reflective layer 15 has an electrically insulating material 20 situated underneath it and is thereby electrically insulated from the carrier plate 16.

The chip carrier 4 has a housing frame 17, to which a covering plate 7 provided with a converter layer 8 is applied.

Figure 4C:
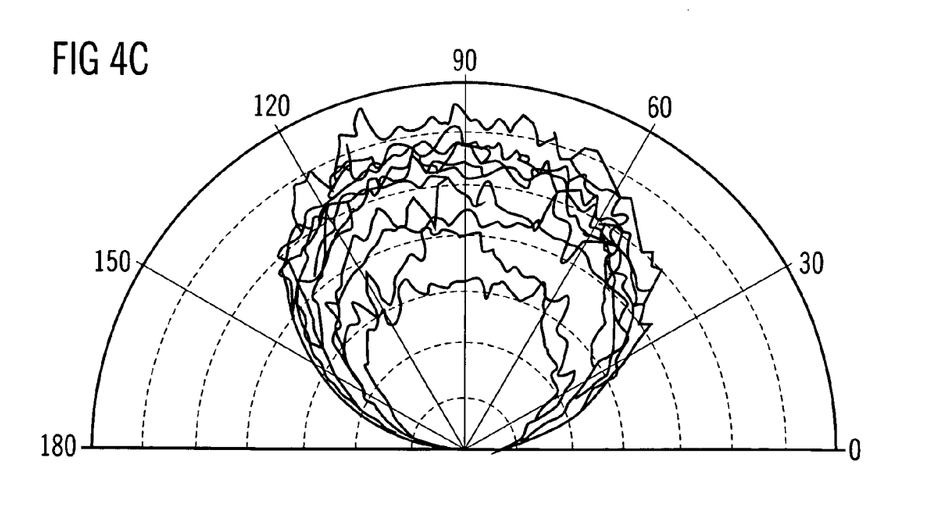

The light coupling-out area of thin-film light emitting diodes is essentially defined by their front main area, as a result of which they have a Lambert emission characteristic to a good approximation. As a result, thin-film light emitting diodes are particularly well suited to components with a multiplicity of light emitting diodes since with them the emitted light intensity can be increased without significantly changing the emission characteristic of the components, that is to say that they have a very good scalability. This is illustrated in the polar diagram of FIG. 4C, which demonstrates the emission characteristic of semiconductor components in accordance with FIGS. 4A and 4B for different sizes, that is to say for a different number of thin-film light emitting diodes (light intensity as a function of the angle). The more light emitting diodes the component has, the greater the light intensity becomes but the emission characteristic remains essentially the same.

It goes without saying that above explanation of the invention on the basis of the exemplary embodiments is not to be regarded as a restriction of the invention thereto. Features that have been explained on the basis of different exemplary embodiments can be combined arbitrarily with one another independently of the exemplary embodiment.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A light emitting semiconductor component with at least one thin-film light emitting diode chip which is applied on a chip carrier having electrical connecting conductors and an epitaxial semiconductor layer sequence, wherein the semiconductor layer sequence is arranged on a carrier and comprises:
   (a) an n-conducting semiconductor layer, a p-conducting semiconductor layer and an electromagnetic radiation generating region arranged between these two semiconductor layers;
   (b) at least one semiconductor layer with at least one micro-patterned, rough area;
   (c) a coupling-out area essentially defined by a main area facing away from the carrier;
   (d) a housing frame arranged on one of the chip carrier and a housing bottom which is different than the chip carrier, the housing bottom including a plurality of electrical connecting conductors to which the chip carrier is applied and electrically connected such that a housing cavity is defined in which the thin-film light emitting diode is arranged; and
   (e) a radiation-transmissive covering plate arranged to essentially at least one of cover and close an opening of the housing cavity;
   wherein a reflective layer is arranged at a main area of the semiconductor facing toward the carrier, which reflective layer reflects at least one part of the electromagnetic radiation generated in the semiconductor sequence layer back into the semiconductor sequence layer, and the coupling-out area adjoins at least one element of the group consisting of a region filled with gas, a region filled with a vacuum, and a luminescence conversion material wavelength-converting at least one part of an electromagnetic radiation emitted by the thin-film light emitting diode chip and adjoining the region filled with gas or the vacuum;
   the epitaxial semiconductor layer sequence generates electromagnetic radiation at a wavelength in the UV range;
   the thin-film light emitting diode chip has a thickness of less than 100 μm inclusive; and
   wherein at least one part of the luminescence conversion material is applied to at least one of two main areas of the covering plate, the luminescence conversion material completely covering one of the main areas of the covering plate.

2. The light emitting semiconductor component as claimed in claim 1, wherein the semiconductor layer sequence contains at least one material from the system $In_xAl_yGa_{1-x-y}N$ where $0 \leq x \leq 1$, $0 \leq y \leq 1$ and $x+y \leq 1$.

3. The light emitting semiconductor conductor as claimed in claim 1, wherein the main area of the radiation-transmissive covering plate that faces an interior of the housing cavity is covered by the conversion material.

4. The light emitting semiconductor component as claimed in claim 1, wherein the carrier on which the semiconductor layer sequence is arranged is a carrier substrate.

5. The light emitting semiconductor component as claimed in claim 4, wherein the carrier substrate is a semiconductor carrier substrate.

6. The light emitting semiconductor component as claimed in claim 1, wherein the carrier on which the semiconductor layer sequence is arranged is the chip carrier.

7. The light emitting semiconductor component as claimed in claim 1, wherein the housing cavity is defined by a leadframe around which a housing basic body is formed, the bottom of the housing basic body with the part of the leadframe integrated therein forming the chip carrier or the housing bottom.

8. The light emitting semiconductor component as claimed in claim 7, wherein the housing basic body is essentially composed of plastic.

9. The light emitting semiconductor component as claimed in claim 1, wherein inner walls of the housing cavity are at least partly provided with a layer which is reflective for an electromagnetic radiation generated in the semiconductor component.

10. The light emitting semiconductor component as claimed in claim 9, wherein the reflective layer is electrically conductive and also electrically connected to the thin-film light emitting diode chip.

11. The light emitting semiconductor component as claimed in claim 9, wherein the layer is a metallic or oxidic layer.

12. The light emitting semiconductor component as claimed in claim 11, wherein the layer includes $TiO_2$, Ag, Al or Au.

13. The light emitting semiconductor component as claimed in claim 1, wherein inner walls of the housing cavity are at least partly provided with a diffusor material or with a layer which is diffusely reflective for an electromagnetic radiation generated in the semiconductor component.

14. The light emitting semiconductor component as claimed in claim 1, wherein the housing cavity is closed off in at least one of a gastight and watertight manner.

15. The light emitting semiconductor component as claimed in claim 1, wherein the radiation-transmissive covering plate is shaped at least such that said radiation-transmissive covering plate comprises an optical device for beam shaping of an electromagnetic radiation emitted by the semiconductor component.

16. The light emitting semiconductor component as claimed in claim 15, wherein the optical device comprises a focusing apparatus.

17. The light emitting semiconductor component as claimed in claim 1, wherein the radiation-transmissive covering plate essentially comprises at least one of glass, quartz glass, ceramic and glass ceramic.

18. The light emitting semiconductor component as claimed in claim 1, wherein the covering plate is provided with a diffusor material which is at least one of contained in the radiation-transmissive covering plate and applied on the covering plate.

19. The light emitting semiconductor component as claimed in claim 1, wherein at least one main area of the covering plate has a rough structure.

20. The light emitting semiconductor component as claimed in claim 19, wherein at least one main area of the covering plate that faces an interior of the housing cavity has a rough structure.

21. The light emitting semiconductor component as claimed in claim 19, wherein the rough structure of the at least one main area of the radiation-transmissive covering plate is irregular.

22. The light emitting semiconductor component as claimed in claim 19, wherein the rough structure of the at least one main area of the radiation-transmissive covering plate has a structure size which is an order of magnitude of a wavelength of an electromagnetic radiation emitted by the semiconductor component.

23. The light emitting semiconductor component as claimed in claim 21, wherein the rough structure of the at least one main area of the radiation-transmissive covering plate comprises a multiplicity of partial areas which are oblique with respect to a main plane of extent of the semiconductor layer sequence and form a multiplicity of different angles with the semiconductor layer sequence, and which are distributed statistically over an entirety of the at least one main area.

24. The light emitting semiconductor component as claimed in claim 23, wherein the multiplicity of partial areas are distributed statistically over the entirety of the at least one entire main area with regard to said multiplicity of different angles.

25. The light emitting semiconductor component as claimed in claim 1, wherein an additional luminescence conversion material is arranged downstream of the thin-film light emitting diode in an emission direction, the additional luminescence conversion material wavelength-converting at least one part of an electromagnetic radiation emitted by the thin-film light emitting diode.

26. The light emitting semiconductor component as claimed in claim 25, wherein the luminescence conversion material comprises at least two phosphors that differ with regard to at least one of conversion properties and particle size.

27. The light emitting semiconductor component as claimed in claim 14, wherein a luminescence conversion material is arranged downstream of the thin-film light emitting diode in the emission direction, the luminescence conversion material wavelength-converting at least one part of an electromagnetic radiation emitted by the thin-film light emitting diode; and wherein at least one part of the luminescence conversion material is admixed with the radiation-transmissive covering plate.

28. The light emitting semiconductor component as claimed in claim 1, wherein the luminescence conversion material is applied in the form of a converter layer having a surface which comprises a rough structure.

29. The light emitting semiconductor component as claimed in claim 28, wherein the rough structure of the converter layer is irregular.

30. The light emitting semiconductor component as claimed in claim 28, wherein the converter layer comprises a multiplicity of crystallites, and the rough structure of the converter layer is essentially defined by the form of the crystallites.

31. The light emitting semiconductor component as claimed in claim 28, wherein the rough structure of the converter layer has a structure size which is of the an order of magnitude of the a wavelength of an electromagnetic radiation emitted by the semiconductor component.

32. The light emitting semiconductor component as claimed in claim 29, wherein the rough structure of the converter layer comprises a multiplicity of partial areas which are oblique with respect to a main plane of extent of the semiconductor layer sequence and form a multiplicity of different angles with the semiconductor layer sequence, and which are distributed statistically over an entirety of the converter layer.

33. The light emitting semiconductor component as claimed in claim 32, wherein the multiplicity of partial areas are distributed statistically over the entirety of the at least one main area with regard to said multiplicity of different angles.

34. The light emitting semiconductor component as claimed in claim 1, wherein the luminescence conversion material comprises at least two phosphors that differ with regard to conversion properties and particle size.

35. The light emitting semiconductor component as claimed in claim 1, wherein the luminescence conversion material has a surface comprising a rough structure.

36. The light emitting semiconductor component as claimed in claim 35, wherein the rough structure of the luminescence conversion material is irregular.

37. The light emitting semiconductor component as claimed in claim 36, wherein the rough structure of the luminescence conversion material comprises a multiplicity of partial areas which are oblique with respect to a main plane of extent of the semiconductor layer sequence and form a multiplicity of different angles with the semiconductor layer sequence, and which are distributed statistically over an entirety of the luminescence conversion material.

38. The light emitting semiconductor component as claimed in claim 35, wherein the luminescence conversion material comprises a multiplicity of crystallites, and the rough structure of the luminescence conversion material is essentially defined by the form of the crystallites.

39. The light emitting semiconductor component as claimed in claim 35, wherein the rough structure of the luminescence conversion material has a structure size of an order of magnitude of a wavelength of an electromagnetic radiation emitted by the semiconductor component.

40. The light emitting semiconductor component as claimed in claim 37, wherein the multiplicity of partial areas are distributed statistically over the entirety of the at least one main area with regard to said multiplicity of different angles.

41. A light emitting semiconductor component with at least one thin-film light emitting diode chip which is applied on a chip carrier having electrical connecting conductors and an epitaxial semiconductor layer sequence, wherein the semiconductor layer sequence is arranged on a carrier and comprises;
   (a) an n-conducting semiconductor layer, a p-conducting semiconductor layer and an electromagnetic radiation generating region arranged between these two semiconductor layers;
   (b) at least one semiconductor layer with at least one micro-patterned, rough area;
   (c) a housing frame arranged on one of the chip carrier and a housing bottom which is different than the chip carrier, the housing bottom including a plurality of electrical connecting conductors to which the chip carrier is applied and electrically connected such that a housing cavity is defined in which the thin-film light emitting diode is arranged: and (d) a radiation-transmissive covering plate arranged to essentially at least one of cover and close an opening of the housing cavity;

wherein a reflective layer is arranged at a main area of the semiconductor layer sequence facing toward the carrier, which reflective layer reflects at least one part of the electromagnetic radiation generated in the semiconductor layer sequence back into the semiconductor layer sequence;

an emission side of the thin-film light emitting diode chip facing away from the chip carrier is free of housing material;

the carrier on which the semiconductor layer sequence is arranged is a carrier substrate of the thin-film light emitting diode chip, said carrier substrate being arranged between the chip carrier and the reflective layer;

the epitaxial semiconductor layer sequence generates electromagnetic radiation at a wavelength in the UV range;

the thin-film light emitting diode chip has a thickness of less than 100 μm inclusive; and wherein at least one part of the luminescence conversion material is applied to at least one of two main areas of the covering plate, the luminescence conversion material completely covering one of the main areas of the covering plate.

42. The light emitting semiconductor component as claimed in claim 41, wherein the carrier substrate is a semiconductor carrier substrate.

43. A light emitting semiconductor component with at least one thin-film light emitting diode chip which is applied on a chip carrier having electrical connecting conductors and an epitaxial semiconductor layer sequence, wherein the semiconductor layer sequence is arranged on a carrier and comprises:

(a) an n-conducting semiconductor layer, a p-conducting semiconductor layer and an electromagnetic radiation generating region arranged between these two semiconductor layers;

(b) at least one semiconductor layer with at least one micro-patterned, rough area;

(c) a housing frame arranged on one of the chip carrier and a housing bottom which is different than the chip carrier, the housing bottom including a plurality of electrical connecting conductors to which the chip carrier is applied and electrically connected such that a housing cavity is defined in which the thin-film light emitting diode is arranged; and (d) a radiation-transmissive covering plate arranged to essentially at least one of cover and close an opening of the housing cavity;

wherein a reflective layer is arranged at a main area of the semiconductor layer sequence facing toward the carrier, which reflective layer reflects at least one part of the electromagnetic radiation generated in the semiconductor layer sequence back into the semiconductor layer sequence;

an emission side of the thin-film light emitting diode chip facing away from the chip carrier is free of housing material;

a growth substrate on which the epitaxial semiconductor layer sequence is grown is removed at least for the most part; and the thin-film light emitting diode chip is free of a carrier substrate at the emission side of the thin-film light emitting diode chip facing away from the chip carrier;

the epitaxial semiconductor layer sequence generates electromagnetic radiation at a wavelength in the UV range;

the thin-film light emitting diode chip has a thickness of less than 100 μm inclusive; and wherein at least one part of the luminescence conversion material is applied to at least one of two main areas of the covering plate, the luminescence conversion material completely covering one of the main areas of the covering plate.

44. A light emitting semiconductor component with at least one thin-film light emitting diode chip which is applied on a chip carrier having electrical connecting conductors and also an epitaxial semiconductor layer sequence, wherein the semiconductor layer sequence is arranged on a carrier and comprises:

(a) an n-conducting semiconductor layer, a p-conducting semiconductor layer and an electromagnetic radiation generating region arranged between these two semiconductor layers; and (b) at least one semiconductor layer with at least one micro-patterned, rough area;

wherein a reflective layer is arranged at a main area of the semiconductor layer sequence facing toward the carrier, which reflective layer reflects at least one part of the electromagnetic radiation generated in the semiconductor layer sequence back into the latter;

an emission side of the thin-film light emitting diode chip facing away from the chip carrier is free of housing material;

the semiconductor component having a housing frame and electrical connectors, said semiconductor being arranged on one of the chip carrier and a housing bottom which is different than the chip carrier, the chip carrier being applied to and electrically connected to the electrical connecting conductors of the semiconductor component such that a housing cavity is defined in which the thin-film light emitting diode chip is arranged;

the semiconductor component comprises a radiation-transmissive covering plate fitted such that the covering plate essentially at least one of covers and closes an opening of the housing cavity; and a luminescence conversion material that wavelength-converts at least one part of the electromagnetic radiation emitted by the thin-film light emitting diode chip is admixed with the covering plate;

the epitaxial semiconductor layer sequence generates electromagnetic radiation at a wavelength in the UV range; and wherein the thin-film light emitting diode chip has a thickness of less than 100 μm inclusive.

45. The light emitting semiconductor component as claimed in claim 1, wherein the thin-film light emitting diode chip is contact-connected on two opposite main areas.

46. The light emitting semiconductor component as claimed in claim 44, wherein the thin-film light emitting diode chip is contact-connected on two opposite main areas.

* * * * *